(12) United States Patent
Knapp et al.

(10) Patent No.: US 10,115,593 B2
(45) Date of Patent: Oct. 30, 2018

(54) CHEMICAL MODIFICATION OF HARDMASK FILMS FOR ENHANCED ETCHING AND SELECTIVE REMOVAL

(71) Applicant: APPLIED MATERIALS, INC., Santa Clara, CA (US)

(72) Inventors: David Knapp, Santa Clara, CA (US); Simon Huang, Campbell, CA (US); Jeffrey W. Anthis, San Jose, CA (US); Philip Alan Kraus, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/833,728

(22) Filed: Dec. 6, 2017

(65) Prior Publication Data

US 2018/0096834 A1    Apr. 5, 2018

Related U.S. Application Data

(63) Continuation of application No. 15/283,400, filed on Oct. 1, 2016, now Pat. No. 9,870,915.

(51) Int. Cl.
| | |
|---|---|
| *H01L 21/033* | (2006.01) |
| *H01J 37/32* | (2006.01) |
| *H01L 21/02* | (2006.01) |
| *B82Y 30/00* | (2011.01) |
| *C08K 3/04* | (2006.01) |

(52) U.S. Cl.
CPC .......... *H01L 21/0332* (2013.01); *B82Y 30/00* (2013.01); *C08K 3/04* (2013.01); *H01J 37/32009* (2013.01); *H01L 21/0206* (2013.01); *H01L 21/0335* (2013.01); *H01L 21/0337* (2013.01); *H01J 2237/334* (2013.01)

(58) Field of Classification Search
CPC ............. H01L 21/0332; H01L 21/0206; H01L 21/035; H01L 21/0337; C08K 3/04; H01J 37/32009; H01J 2237/334; B82Y 30/00
USPC ......................................................... 438/778
See application file for complete search history.

(56) References Cited

U.S. PATENT DOCUMENTS

| 9,287,124 | B2 | 3/2016 | Kong et al. | |
|---|---|---|---|---|
| 2007/0104892 | A1* | 5/2007 | Ishida | B82Y 30/00 427/577 |
| 2016/0225632 | A1 | 8/2016 | Shaikh et al. | |
| 2016/0293441 | A1 | 10/2016 | Lee et al. | |

\* cited by examiner

*Primary Examiner* — Amanda C. Walke
(74) *Attorney, Agent, or Firm* — Schwabe, Williamson & Wyatt, P.C.

(57) ABSTRACT

Embodiments include a method of processing a hardmask that includes forming an alloyed carbon hardmask over an underlying layer. In an embodiment, the alloyed carbon hardmask is alloyed with metallic-carbon fillers. The embodiment further includes patterning the alloyed carbon hardmask and transferring the pattern of the alloyed carbon hardmask into the underlying layer. According to an embodiment, the method may further include removing the metallic component of the metallic-carbon fillers from the alloyed carbon hardmask to form a porous carbon hardmask. Thereafter, the porous hardmask may be removed. In an embodiment, the metallic component of the metallic-carbon fillers may include flowing a processing gas into a chamber that volatizes the metallic component of the metallic-carbon fillers.

20 Claims, 8 Drawing Sheets

CHEMICAL MODIFICATION OF HARDMASK FILMS FOR ENHANCED ETCHING AND SELECTIVE REMOVAL

CROSS-REFERENCE TO RELATED APPLICATIONS

This is a Continuation Application of Ser. No. 15/283,400, filed on Oct. 1, 2016, entitled "CHEMICAL MODIFICATION OF HARDMASK FILMS FOR ENHANCED ETCHING AND SELECTIVE REMOVAL", which is presently pending, the entire contents of which is hereby incorporated by reference in its entirety for all purposes.

FIELD

Embodiments relate to the field of lithographic processing for semiconductor applications and, in particular, to a hardmask film that is chemically modifiable to allow for high etch selectivity and easy removal of the hardmask.

DESCRIPTION OF RELATED ART

Hardmasks are used in many patterning operations for semiconductor device manufacturing. High quality hardmasks allow for the transfer of patterns into underlying layers with tight dimension control. In order to achieve tight dimensional control, the hardmask film possess a high etch selectivity to the underlying layers during the etching process. One material that has been used as a hardmask is a carbon layer. As used herein, a "carbon layer" or a "carbon hardmask" may refer to a layer that is comprised of one or more of amorphous carbon or carbide. Such carbon based hardmasks are particularly useful in semiconductor device manufacturing due to a high etch selectivity to silicon containing materials. For example, carbon based hardmasks have high etch selectivity to polysilicon, $SiO_2$, and $Si_3N_4$. In advanced patterning operations, the carbon layer may be alloyed to further enhance the etch selectivity of the hardmask. For example, metallic components may be added to the carbon hardmask to increase the etch selectivity to underlying layers.

Typically, the hardmask is removed with an oxygen plasma (e.g., an ashing process) after the hardmask is no longer needed. However, alloying the carbon hardmask increases the difficulty of removing the hardmask with such processes. Accordingly, the increased etch selectivity comes with the disadvantage of making the hardmask more difficult to remove.

SUMMARY

Embodiments include a method of processing a hardmask that includes forming an alloyed carbon hardmask over an underlying layer. In an embodiment, the alloyed carbon hardmask is alloyed with metallic-carbon fillers. The embodiment further includes patterning the alloyed carbon hardmask and transferring the pattern of the alloyed carbon hardmask into the underlying layer. According to an embodiment, the method may further include removing the metallic component of the metallic-carbon fillers from the alloyed carbon hardmask to form a porous carbon hardmask. Thereafter, the porous hardmask may be removed. In an embodiment, the metallic component of the metallic-carbon fillers may include flowing a processing gas into a chamber that volatizes the metallic component of the metallic-carbon fillers.

An additional embodiment may include a method of processing an alloyed carbon layer that includes forming the alloyed carbon layer that is alloyed with metallic-carbon fillers that are boron-carbon fillers. The embodiment may also include removing the boron component of the boron-carbon fillers from the carbon layer to form a porous carbon layer. In an embodiment, the boron-carbon fillers are removed by flowing a processing gas into a chamber. In an embodiment, the processing gas volatizes the boron component of the boron-carbon fillers. In an embodiment, the processing gas is chlorine, bromine, iodine, hydrogen chloride, hydrogen bromide, hydrogen iodide, thionyl chloride, thionyl bromide, iodine monobromide, or sulfuryl chloride.

DETAILED DESCRIPTION

Figure 1A:
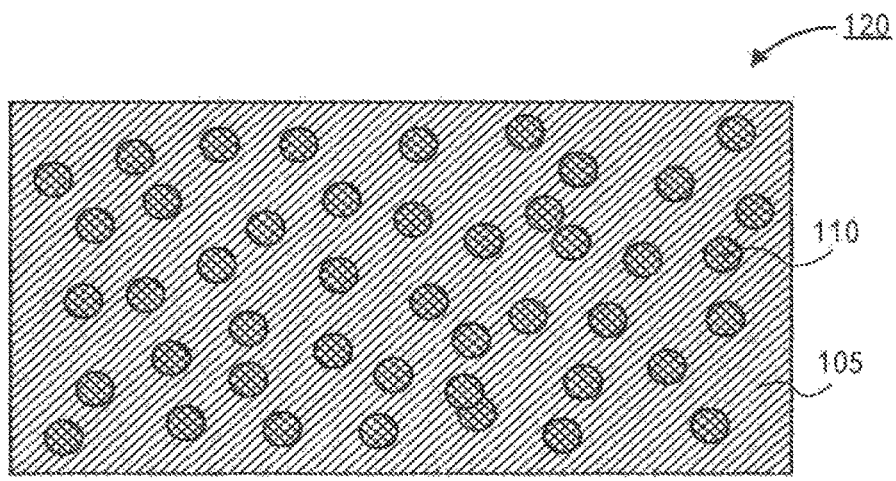
FIG. 1A is a cross-sectional illustration of an alloyed carbon layer, according to an embodiment.

Methods of using alloyed carbon hardmasks are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As described above, alloyed carbon hardmasks provide enhanced etch selectivity over unalloyed carbon hardmasks. However, the use of alloyed carbon hardmask layers in semiconductor device manufacturing is currently limited due to the increased difficulty in removing the hardmask after the hardmask is no longer needed. As such, embodiments include an alloyed carbon hardmask and patterning process that allows for improved etch selectivity while at the same time allowing for easy removal of the hardmask material after the hardmask is no longer needed.

According to an embodiment, the alloyed carbon hardmask is a chemically modifiable hardmask mask material. The alloyed carbon hardmask may be patterned with the pattern subsequently being transferred to an underlying layer, as is known in the art. Embodiments may then implement a process for chemically modifying the hardmask material to make it easier to remove the hardmask. Particularly, embodiments include chemical modification that substantially removes the alloy constituents from the alloyed carbon hardmask. Once the alloy constituents have been removed, the hardmask may be removed with little difficulty using currently available processing techniques, such as with an oxygen plasma etch. Accordingly, embodiments allow for the improved etch resistance needed for advanced patterning processes provided by alloyed carbon hardmasks while still retaining the ability to easily remove the hardmask after it is no longer needed.

Additional embodiments may also utilize a second mask layer to selectively modify an alloyed carbon hardmask. For example, a second mask may be formed over the alloyed carbon hardmask. The second mask may shield portions of the alloyed carbon hardmask from the chemical modification process. As such, a subsequent plasma etch may only remove the chemically modified portions of the alloyed carbon hardmask.

Further embodiments of the may include realloying the chemically modified carbon layer after the first alloy constituents have been removed to form a porous carbon layer. For example, the realloying may provide a second alloy constituent that provides desired properties to the carbon layer after the carbon layer has been turned into a porous carbon layer. Accordingly, embodiments allow for a porous carbon layer to be tailored to provide desired material properties that may allow for uses in applications beyond semiconductor manufacturing applications.

Figure 1B:
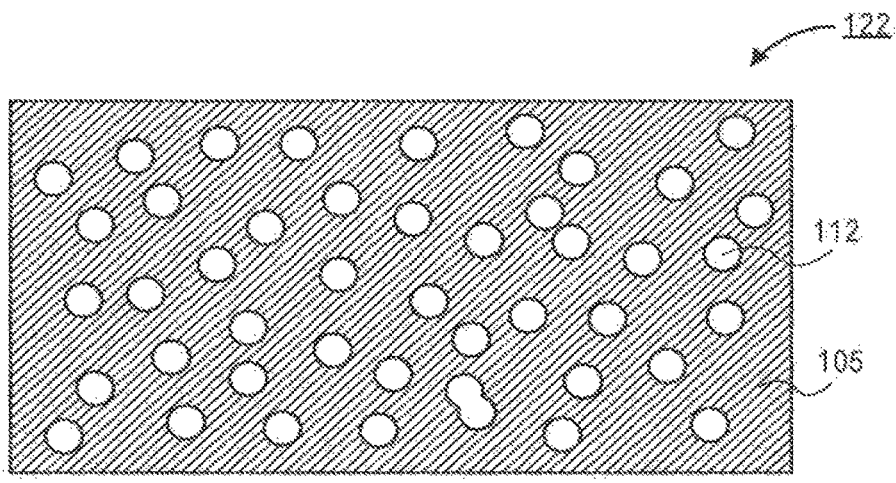
FIG. 1B is a cross-sectional illustration of the alloyed carbon layer after the alloy constituent has been removed to form a porous carbon layer, according to an embodiment.
Figure 1C:
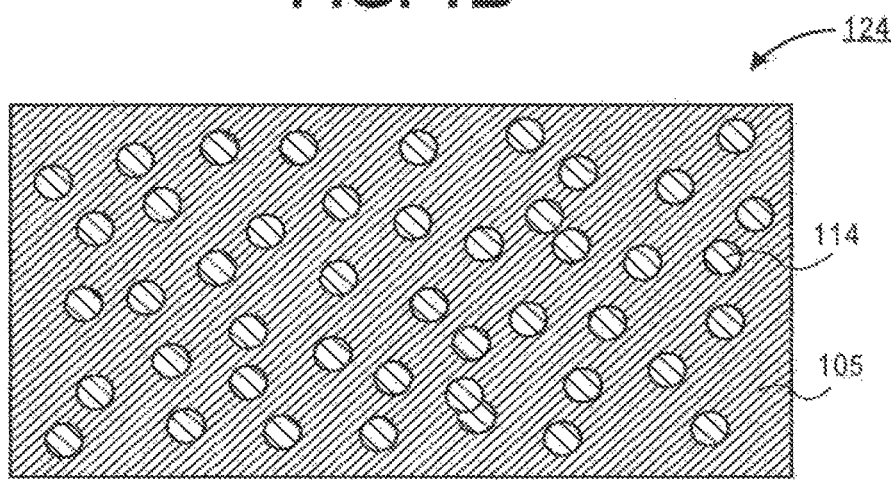
FIG. 1C is a cross-sectional illustration of the porous carbon layer after a second alloy constituent has been introduced into the porous carbon layer to form a fortified carbon layer, according to an embodiment.
Figure 2:
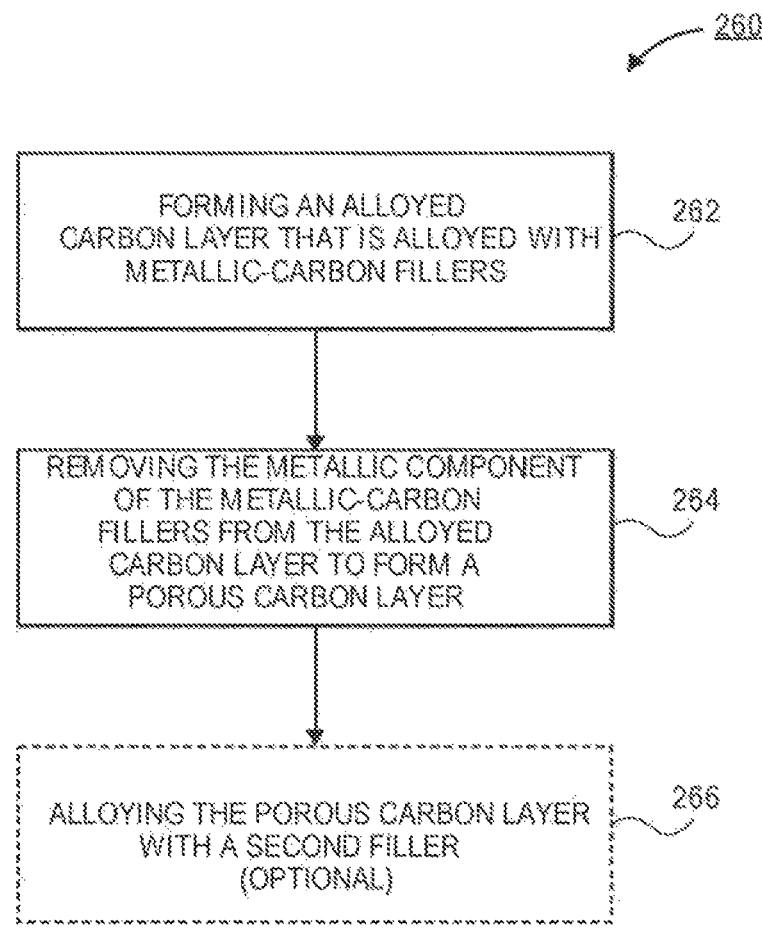
FIG. 2 is a flow chart of a process used for processing an alloyed carbon layer, according to an embodiment.

Referring now to FIGS. 1A-1C and FIG. 2, a process for chemically modifying an alloyed carbon layer is shown and described, according to an embodiment. Referring now to FIG. 2, a process 260 may begin with operation 262 which includes forming an alloyed carbon layer 120 that includes a carbon layer 105 that is alloyed with a metallic-carbon filler 110. Such an alloyed carbon layer 120 is illustrated in FIG. 1A, according to an embodiment.

In an embodiment, the carbon layer 105 may be comprised of one or more of amorphous carbon or carbide. In an embodiment, the carbon layer 105 may include carbon and hydrogen. For example, the atomic percentage of hydrogen may be between 5% and 50% of the carbon layer 105. Furthermore, the atomic percentage of the metallic-carbon filler (i.e., the alloy constituent) 110 in the alloyed carbon layer 120 may be between approximately 5% and 90%. In an embodiment, the metallic-carbon filler 110 may be evenly distributed throughout the carbon layer 105. In the illustrated embodiment, the metallic-carbon fillers 110 are shown as being substantially discrete particles. However, it is to be appreciated that, in some embodiments, the metallic-carbon fillers 110 may overlap and/or form a connected network of metallic carbon fillers 110. For example, the metallic portions of the metallic-carbon fillers 110 may form bonds with carbon, with hydrogen, and/or with other metallic portions of neighboring metallic-carbon fillers 110.

According to an embodiment, the metallic-carbon filler 110 may be a material that is removable with a chemical modification process, which will be described in greater detail below. The metallic component of the metallic-carbon filler 110 may be any suitable metal. In a particular embodiment, the metallic component may be boron to form a boron carbide (e.g., $B_4C$). Additional embodiments may include metallic components, such as, but not limited to W, V, Nb, Ta, Ti, Zr, Hf, and Al.

After the alloyed carbon layer 120 has been formed it may then be used to pattern an underlying layer. In such embodiments, the alloyed carbon layer may be referred to as an alloyed carbon hardmask. The patterning process will be described in greater detail below. After the patterning has been completed and the alloyed carbon layer 120 is no longer needed, embodiments include chemically modifying the alloyed carbon layer 120 to remove the metallic portions of the metallic-carbon filler 110 to form a porous carbon layer 122, as shown in operation 264 in FIG. 2. Such a porous carbon layer 122 is shown in FIG. 1B, according to an embodiment. As illustrated, the metallic-carbon filler 110 has been removed to form voids 112 in the carbon layer 105. Additional embodiments may include voids 112 that connect together to form a void network through the porous carbon layer 122. A void network may provide diffusion pathways through the carbon layer 105 and aid in the removal of the metallic components of the metallic-carbon fillers and/or aid in a subsequent realloying process described in greater detail below. Furthermore, the removal of the metallic portions of the metallic-carbon fillers 110 will not substantially reduce the thickness of the porous carbon layer 122 compared to the thickness of the alloyed carbon layer 120. With the metallic portions of the metallic-carbon fillers 110 removed, the porous carbon hardmask 122 is easier to remove, (e.g., with an ashing process).

According to an embodiment, the metallic portions of the metallic-carbon filler 110 may be removed with a chemical modification process. The chemical modification process may include exposing the alloyed carbon hardmask 120 to a vapor-phase etchant and halogenating agent that volatizes the metallic portions of the metallic-carbon filler 110. In an embodiment, the chemical modification process volatizes the metallic component of the metallic-carbon filler 110. In an additional embodiment, the chemical modification process may volatize the metallic component and the carbon component of the metallic-carbon filler 110. In embodiments, the halogenating agent comprises chlorine, bromine, iodine, hydrogen chloride, hydrogen bromide, hydrogen iodide, thionyl chloride, thionyl bromide, iodine monobromide, or sulfuryl chloride. In the particular embodiment of a boron-carbide filler 110, thionyl chloride may be used to volatize the boron component of the boron-carbide filler

110. In an additional embodiment, chlorine may be used to volatize the boron component of the boron-carbide filler 110.

In an embodiment, the alloyed carbon layer 120 may be exposed to the chemical modification process in a processing chamber. The processing chamber may be any suitable chamber where the processing gas may be flown. For example, the processing chamber may be a vacuum chamber, such as a plasma processing chamber. In an embodiment, the chemical modification process may be implemented at a pressure below atmospheric pressure. For example, the processing pressure may be implemented at approximately 700 torr or less. In an embodiment, the processing pressure may be approximately 250 torr or less. In an embodiment, the processing pressure may be approximately 25 torr or less. In a particular embodiment, the processing pressure may be approximately 10 torr or less. In an embodiment, the chemical modification process may be implemented at atmospheric pressure, where the halogenating agent is introduced into a chamber purged with an inert gas such as a nitrogen or argon.

In a particular embodiment, the processing gas used in the chemical modification process may be flown into the chamber in a pulsed manner. For example, pulses of processing gas may be flown into the chamber followed by a purge. The ratio of the length of time of the processing gas pulse and the purge may be approximately 1:100 or less. In an embodiment, the pulse of processing gas may be less than one second followed by a purge of multiple seconds. In a particular embodiment, each pulse of processing gas may be less than approximately 0.25 seconds and the purge may be approximately 5 seconds or more. The number of pulse cycles needed to substantially remove the metallic portions of the metallic-carbon fillers 110 from the carbon layer 120 may be dependent on the thickness of the alloyed carbon layer 120. In an embodiment, the number of cycles needed to remove the metallic portions of the metallic-carbon fillers 110 from an alloyed carbon layer 120 may increase linearly with the increase in the thickness of the alloyed carbon layer 120. For example, between 50 and 1000 pulse cycles may be used to remove the metallic portions of the metallic-carbon fillers 110 from an alloyed carbon layer 120 that is between approximately 100 Å and 2,000 Å. As used herein, the terms "remove" and "substantially remove" do not necessarily refer to the complete removal of all metallic portions of the metallic-carbon fillers 110 in a layer. Instead, usage of the phrases "remove" and "substantially remove" mean that a sufficient percentage of the metallic component of the metallic fillers 110 have been removed to change the etch resistance of the chemically modified layer to an etching process used to remove the chemically modified layer. For example, the alloyed carbon layer may be considered to be a porous carbon layer 122 when at least 50% or more of the metallic component of the metallic-carbon fillers 110 are removed. In an embodiment, the alloyed carbon layer may be considered to be a porous carbon layer when at least 95% of the metallic component of the metallic-carbon fillers 110 are removed. In a particular embodiment, the alloyed carbon layer may be considered to be a porous carbon layer when at least 99% of the metallic component of the metallic-carbon fillers 110 are removed.

In an embodiment, the removal rate of the metallic component of the metallic-carbon fillers 110 may be increased by increasing the temperature of the alloyed carbon layer 120. In some embodiments, increasing the temperature of the alloyed carbon layer 120 may exponentially increase the removal rate of the metallic component of the metallic-carbon fillers 110. Increases in the removal rate may allow for fewer pulse cycles or less processing time to be used to form a porous carbon layer from an alloyed carbon layer of a given thickness. In an embodiment, a processing temperature may be between approximately 400° C. and 650° C.

After the metallic component of the metallic-carbon fillers 110 have been removed to form a porous carbon layer 122, the porous carbon layer 122 may be removed with standard carbon removal techniques, such as ashing, and will be described in greater detail below. However, in some embodiments, the porous carbon hardmask 122 may be fortified (i.e., realloyed) with a second filler, as shown in optional operation 266. Such a fortified carbon layer 124 is shown in FIG. 1C, according to an embodiment.

As illustrated in FIG. 1C, the second fillers 114 may be integrated into the carbon layer 105 in the cavities 112 formed by the removal of the metallic portions of the metallic-carbon fillers 112. In an embodiment, the second fillers 114 may be integrated into the fortified carbon layer 124 by a diffusion process. For example, the porous carbon layer 122 may be exposed to a gas containing the second fillers 114. In an embodiment, the second filler 114 completely fills the cavities 112. In an embodiment, the second filler 114 partially fills the cavities 112. In an embodiment, the second filler 114 partially fills the cavities 112 by coating the surfaces of the carbon layer surrounding the cavities 112. In an embodiment, the second fillers 114 may include materials that provide a desired property to the fortified carbon layer 122. In an embodiment, the second fillers 114 may be metals, semiconductors, or metal oxides.

Figure 3A:
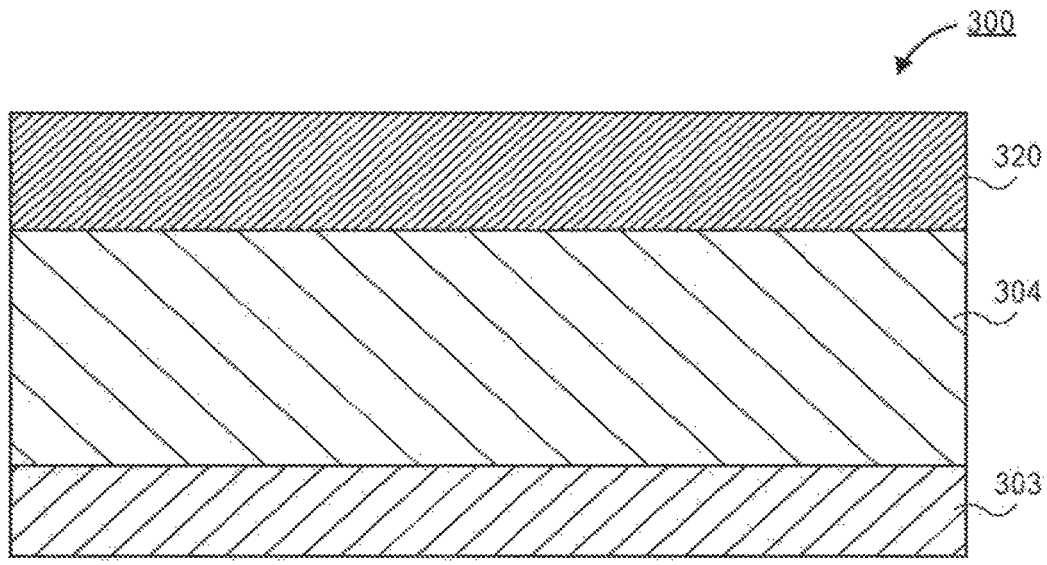
FIG. 3A is a cross-sectional illustration of an alloyed carbon hardmask formed over an underlying layer, according to an embodiment.
Figure 3B:
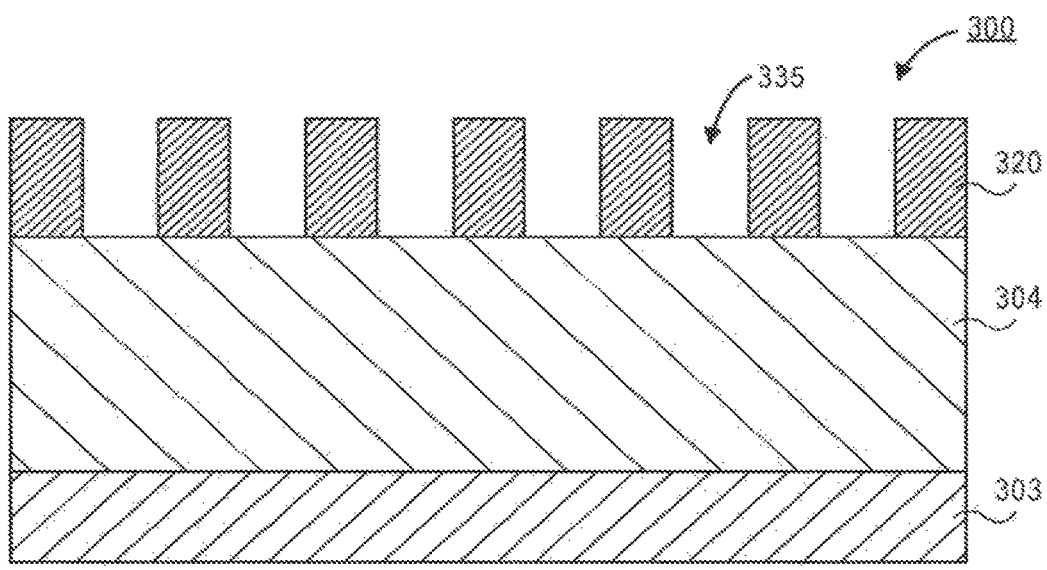
FIG. 3B is a cross-sectional illustration of the alloyed carbon hardmask after the alloyed carbon hardmask has been patterned, according to an embodiment.
Figure 3C:
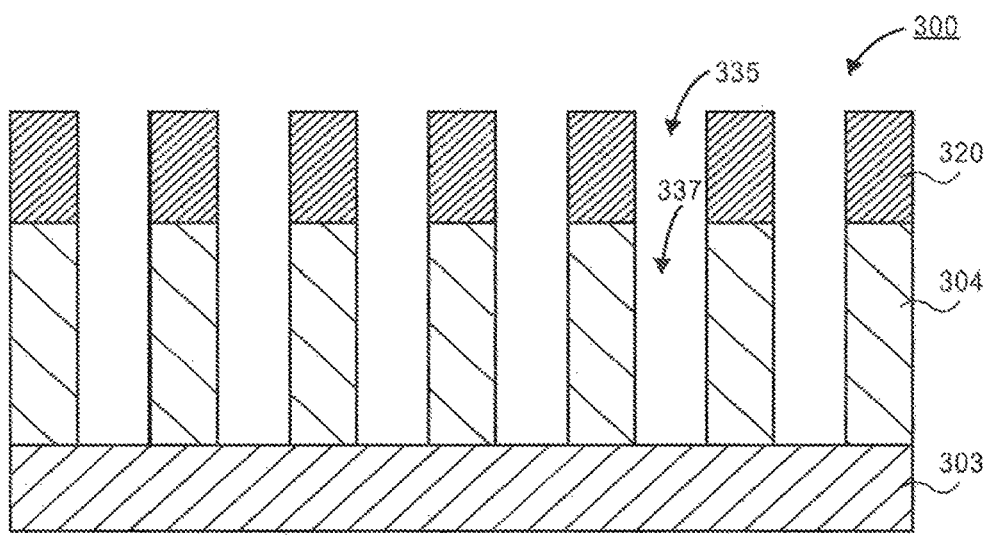
FIG. 3C is a cross-sectional illustration of the alloyed carbon hardmask after the pattern in the hardmask has been transferred into the underlying layer, according to an embodiment.
Figure 3D:
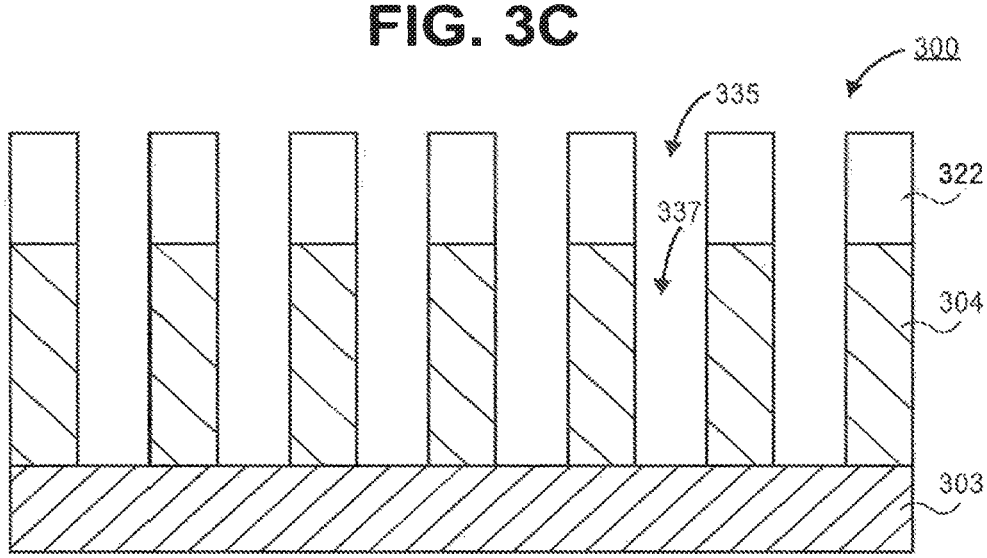
FIG. 3D is a cross-sectional illustration of the alloyed carbon hardmask after the alloy constituent has been removed to form a porous carbon hardmask, according to an embodiment.
Figure 3E:
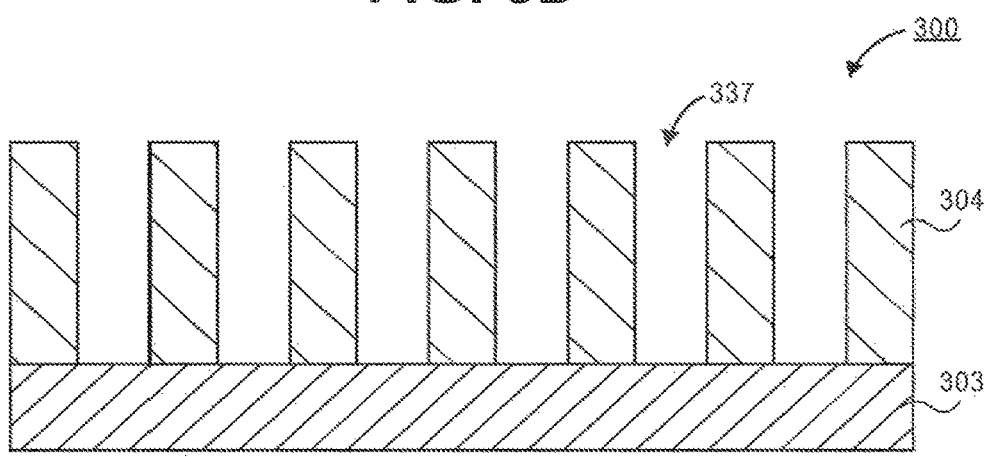
FIG. 3E is a cross-sectional illustration of the patterned substrate after the porous carbon hardmask has been removed, according to an embodiment.
Figure 4:
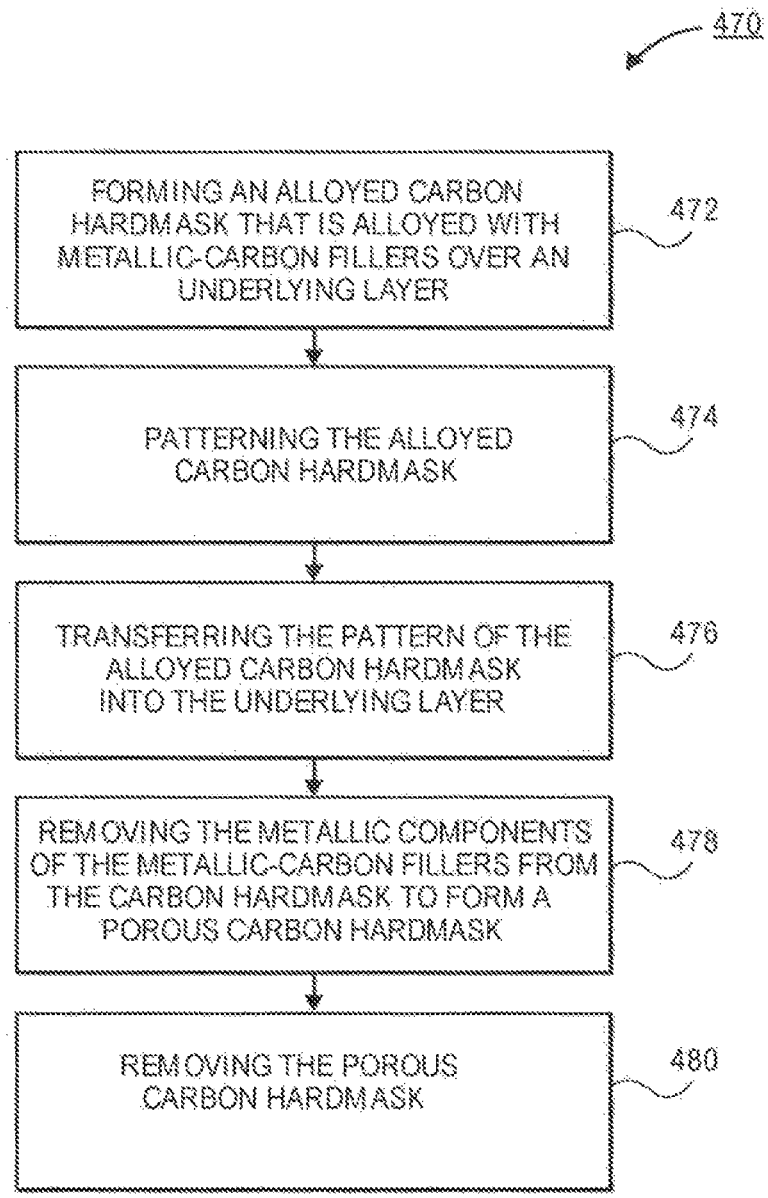
FIG. 4 is a flow chart of a process for using an alloyed carbon hardmask to pattern an underlying layer, according to an embodiment.

Referring now to the cross-sectional illustrations in FIGS. 3A-3E and the process flow chart in FIG. 4, a description of a process 470 for using an alloyed carbon hardmask to pattern an underlying layer is described, according to an embodiment. While the alloyed carbon layer is described and used herein as a hardmask, it is to be appreciated that an alloyed carbon layer similar to the one described above with respect to FIGS. 1A-1C may also be used in many different applications beyond the use as a hardmask for semiconductor device manufacturing.

Starting with operation 472, embodiments include forming a carbon hardmask that is alloyed with metallic-carbon fillers over an underlying layer. A stack 300 of layers that includes an alloyed carbon hardmask 320 is illustrated in FIG. 3A. As illustrated, the alloyed carbon hardmask 320 is formed over an underlying layer 304 that is desired to be patterned. The underlying layer 304 may be formed over a substrate 303. In an embodiment, the underlying layer 304 may be any material layer or stack of material layers that will be patterned with the aid of the alloyed carbon hardmask 320. Accordingly, the underlying layer 304 may include materials that are etched selectively with respect to the alloyed carbon hardmask 320. For example, the underlying layer 304 may include one or more of polysilicon, $SiO_2$, $Si_3N_4$, TiN, Cu, Al, Si, W, Co, Ta, TaN, WN, SiC, SiCN, SiOCN, and SiOC. In an embodiment, the substrate 303 may be any material layer on which the underlying layer may be patterned. In an embodiment, the substrate 303 may be a semiconducting material such as silicon, a III-V semiconductor material, a silicon-on-insulator (SOI), or the like. Additional embodiments may include an etchstop layer (not shown) between the substrate 303 and the underlying layer 304.

In an embodiment, the alloyed carbon hardmask 320 may be substantially similar to the alloyed carbon layer 120 described above. Particularly, the alloyed carbon hardmask 320 may include a carbon material that includes metallic-carbon fillers. For example, the metallic-carbon fillers may be a boron-carbide and the alloyed carbon hardmask 320 may have an atomic percentage of metallic-carbon fillers between 10% and 90%. In the remaining Figures the fillers (and subsequently formed voids) are omitted for simplicity, and the differences between the alloyed carbon hardmask and the porous carbon hardmask are represented by different shadings.

Referring now to operation 474, the alloyed carbon hardmask 320 may be patterned, according to an embodiment. A patterned alloyed carbon hardmask 320 is illustrated in FIG. 3B, according to an embodiment. In FIG. 3B, the alloyed carbon hardmask 320 is shown as being patterned to form a plurality of openings 335 through the alloyed carbon hardmask 320. The plurality of openings 335 may expose a top surface of the underlying layer 304. In the illustrated embodiment, the plurality of openings 335 are patterned so that a plurality of evenly spaced fins are formed, though embodiments are not limited to such configurations, and any desired pattern may be formed into the alloyed carbon hardmask 320.

In an embodiment, the alloyed carbon hardmask 320 may be patterned with any suitable patterning process. For example, a photosensitive resist (not shown) may be deposited over the alloyed carbon hardmask 320, exposed, and developed. The developed photosensitive resist may then be used as an etch mask to transfer the exposure pattern into the alloyed carbon hardmask 320. After transferring the pattern into the alloyed carbon hardmask 320, the photosensitive resist may be stripped.

Referring now to operation 476, the pattern formed in the alloyed carbon hardmask 320 may be transferred into the underlying layer 304. A stack 300 with such a patterned underlying layer 304 is illustrated in FIG. 3C, according to an embodiment. Due to the high etch selectivity of the alloyed carbon hardmask 320 with respect to the underlying layer 304, high aspect ratio features with small critical dimensions may be patterned into the underlying layer 304. As illustrated openings 337 may be formed into the underlying layer 304 that substantially align with the openings 335 formed in the alloyed carbon hardmask 320. In an embodiment, the underlying layer 304 may be patterned with a plasma etching process.

After the underlying layer 304 has been patterned, it may be necessary to remove the alloyed carbon hardmask 320. However, as noted above, the metallic-carbon alloy constituents prevent simple hardmask removal processes known in the art from being used. As such, embodiments may include a chemical modification of the alloyed carbon hardmask 320. Accordingly, operation 478 may include removing the metallic-carbon fillers from the alloyed carbon hardmask 320. A stack 300 with a chemically modified hardmask 322 is illustrated in FIG. 3D, according to an embodiment.

According to an embodiment, the chemically modified hardmask 322 may be substantially similar to the porous carbon hardmask 122 described above. For example, the porous carbon hardmask 322 may include a carbon layer that includes voids or void networks (not visible in FIG. 3D) where the metallic portions of the metallic-carbon fillers were previously located. In an embodiment, the metallic portions of the metallic-carbon fillers may be removed with a process substantially similar to the process described above with respect to FIG. 1B. For example, the stack 300 may be exposed to a vapor-phase etchant and halogenating agent that volatizes the metallic portions of the metallic-carbon filler. In the particular embodiment of a boron-carbide filler, thionyl chloride or chlorine may be used to volatize the boron component of the boron-carbide filler.

In an embodiment, the processing conditions (e.g., the temperatures, pressures, number of pulses, etc.) used to remove the metallic portions of the metallic-carbon fillers from the alloyed carbon hardmask 320 to form the porous carbon hardmask 322 may be substantially similar to those described above. In an embodiment, chemical modification of the alloyed carbon hardmask 320 may be implemented in the same processing chamber used to pattern the underlying layer 304 (i.e., the stack 300 may not need to be moved to a different processing chamber in order to remove the metallic-carbon fillers from the alloyed carbon hardmask 320). In an additional embodiment, the stack 300 may be transferred to a different chamber in order to remove the metallic-carbon fillers from the alloyed carbon hardmask 320.

After the metallic-carbon fillers have been removed from the alloyed carbon hardmask 320 to form a porous carbon hardmask 322, the processing of the stack 300 may continue with operation 480 which includes removing the porous carbon hardmask 322 from the underlying layer 304. A stack 300 with the porous carbon hardmask 322 removed is illustrated in FIG. 3E, according to an embodiment.

According to an embodiment, the porous carbon hardmask 322 may be removed with standard hardmask removal techniques. For example, the porous carbon hardmask 322 may be removed by exposure to gases such as, $N_2O$, $NO$, $O_3$, $CO_2O_2$, $H_2O$, or the like, or by exposure to a plasma formed from gases such as, $N_2O$, $NO$, $O_3$, $CO_2O_2$, $H_2O$, or the like. In an embodiment the plasma may be present in the processing chamber or it may be a remote plasma. In an embodiment, the porous carbon hardmask 322 may be removed while the stack 300 is in the same processing chamber used to remove the metallic portions of the metallic-carbon fillers from the alloyed carbon hardmask 320 or the porous carbon hardmask 322 may be removed in a different processing chamber.

In the illustrated embodiment, the removal of the metallic portions of the metallic-carbon fillers to form the porous carbon hardmask 322 and the ultimate removal of the porous carbon hardmask 322 from the stack 300 are illustrated as two distinct processing operations. However, embodiments are not limited to such configurations. For example, a pulsed process alternating between removal of the metallic component of the metallic-carbon filler and removal of the porous portions of the hardmask may be used. In such embodiments one or more pulses of the processing gas may be used to remove the metallic component of the metallic-carbon filler from an exposed upper portion of the alloyed carbon hardmask 320 (i.e., the entire hardmask may not be rendered porous). Thereafter one or more pulses of the hardmask removal processing gas may be used to remove only the porous portions of the hardmask. This process may be repeated any number of times until the entire hardmask is removed. In yet another embodiment, the processing gas used to volatize the metallic components of the metallic-carbon fillers may be flown into the chamber simultaneously with the processing gasses used to remove the porous carbon hardmask 322.

Referring now to FIGS. 5A-5D, cross-sectional illustrations of a process flow for chemically modifying localized portions of an alloyed carbon hardmask are shown, according to an embodiment. Such an embodiment may be useful when only some regions of the hardmask need to be removed.

Figure 5A:
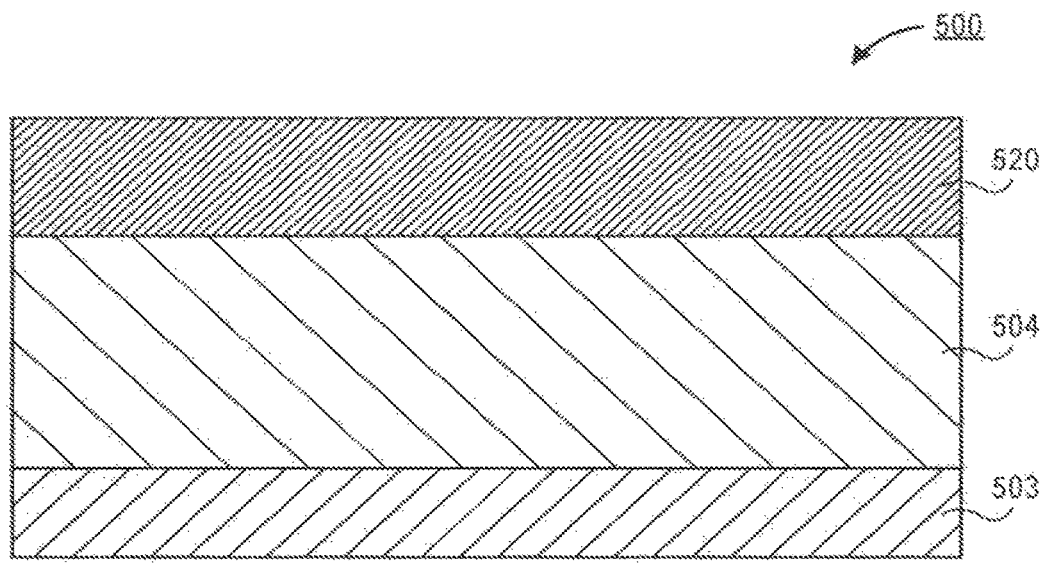
FIG. 5A is a cross-sectional illustration of an alloyed carbon hardmask formed over an underlying layer, according to an embodiment.

Referring now to FIG. 5A, a stack 500 including an alloyed carbon hardmask 520, an underlying layer 504, and a substrate 503 is shown according to an embodiment. The stack 500 may be substantially similar to the stack 300 described above, and therefore will not be described in greater detail here.

Figure 5B:
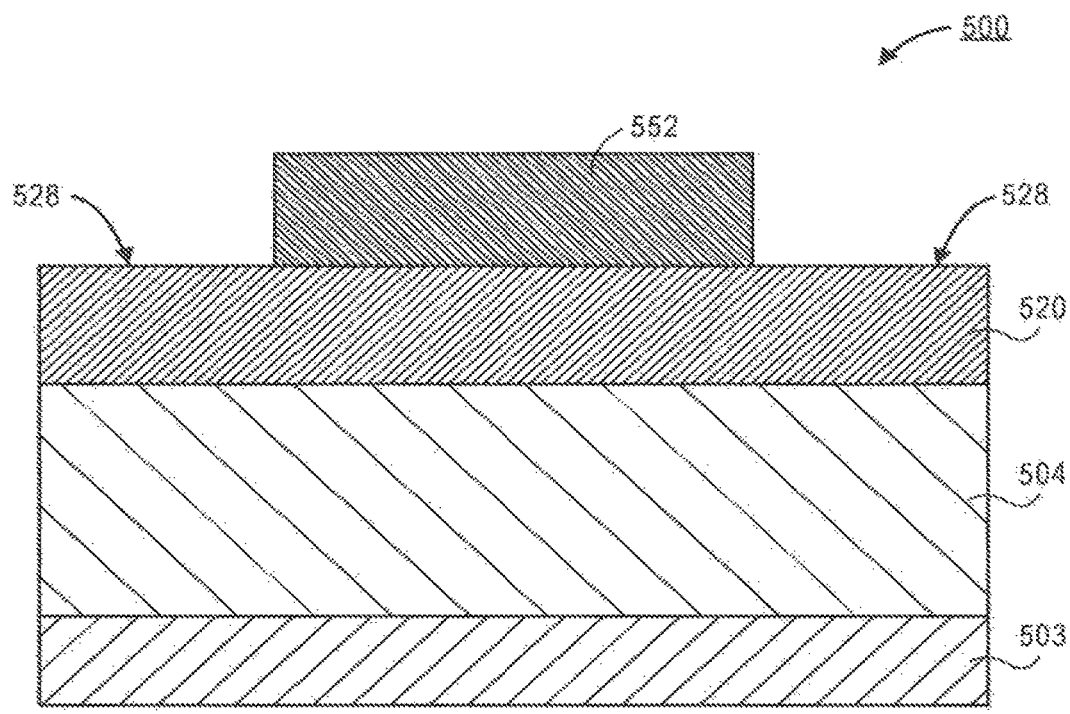
FIG. 5B is a cross-sectional illustration of the alloyed carbon hardmask after a second mask layer is formed over the alloyed carbon hardmask, according to an embodiment.

After the formation of the stack 500, embodiments include forming a second mask layer 552 over the alloyed carbon hardmask 520, as illustrated in FIG. 5B. In an embodiment, the second mask layer 552 may be a photo-sensitive material or an additional carbon hardmask. The second mask layer 552 may be patterned to expose portions 528 of the alloyed carbon hardmask 520.

Figure 5C:
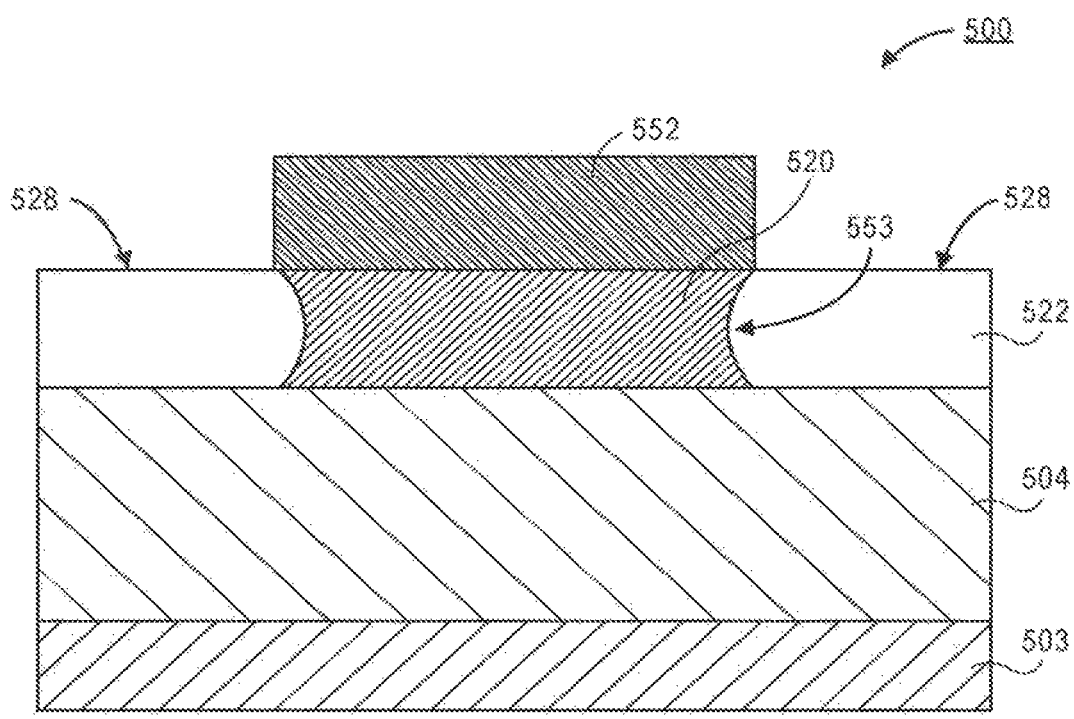
FIG. 5C is a cross-sectional illustration of the alloyed carbon hardmask after the alloy constituent is removed from portions of the alloyed carbon hardmask not covered by the second mask layer to form porous portions of the carbon hardmask, according to an embodiment.
Figure 5D:
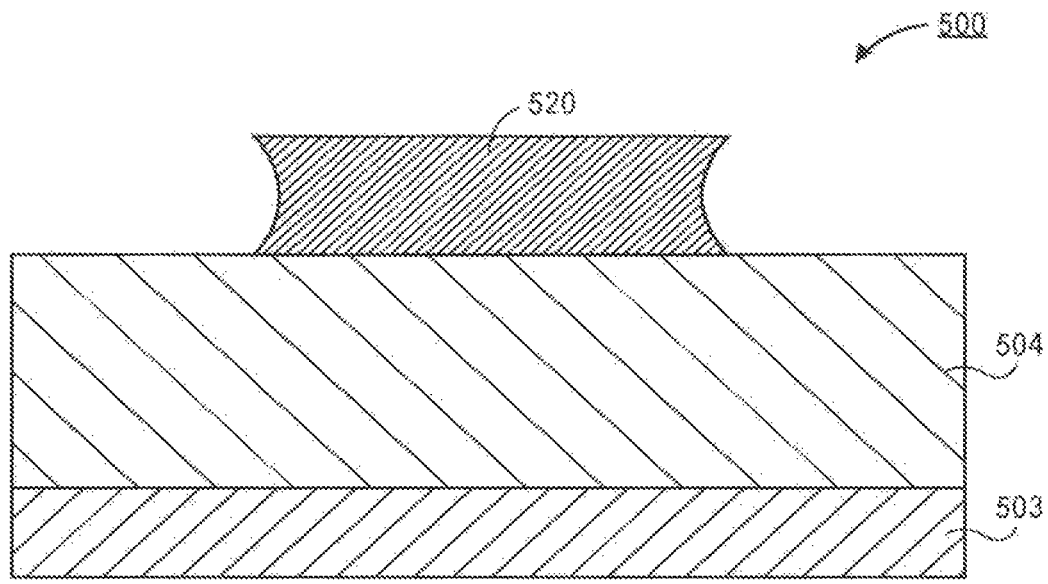
FIG. 5D is a cross-sectional illustration of the alloyed carbon hardmask after the porous portions of the carbon hardmask have been removed, according to an embodiment.

Referring now to FIG. 5C, the alloyed carbon hardmask 520 may be chemically modified to remove the metallic portions of the metallic-carbon fillers in the exposed portions 528 of the alloyed carbon hardmask 520. In such embodiments, the hardmask may, therefore, include portions of porous carbon hardmask material 522 and alloyed carbon hardmask material 520. As illustrated, the exposed portions 528 are converted to the porous carbon hardmask material 522. The portion of the alloyed carbon hardmask material that is covered by the second mask layer 552 is protected from the volatizing gas and is not chemically modified. However, it is to be appreciated that, through diffusion, some portions 553 (e.g., an undercut) below the second mask layer 552 may be chemically modified. Accordingly, the porous portions 522 may be easily removed with hardmask removal processing substantially similar to the processing described above, while the non-chemically modified portions 520 remain behind, as illustrated in FIG. 5D.

In the processing operations illustrated and described above, a single stack 300 or 500 is processed in the processing chamber. However, it is to be appreciated that any number of stacks may be simultaneously processed. For example, a plurality of wafers, each with their own stack or stacks of layers including a chemically modifiable alloyed carbon hardmask may be processed in a single chamber. Alternative embodiments include processing a single wafer at a time.

Figure 6:
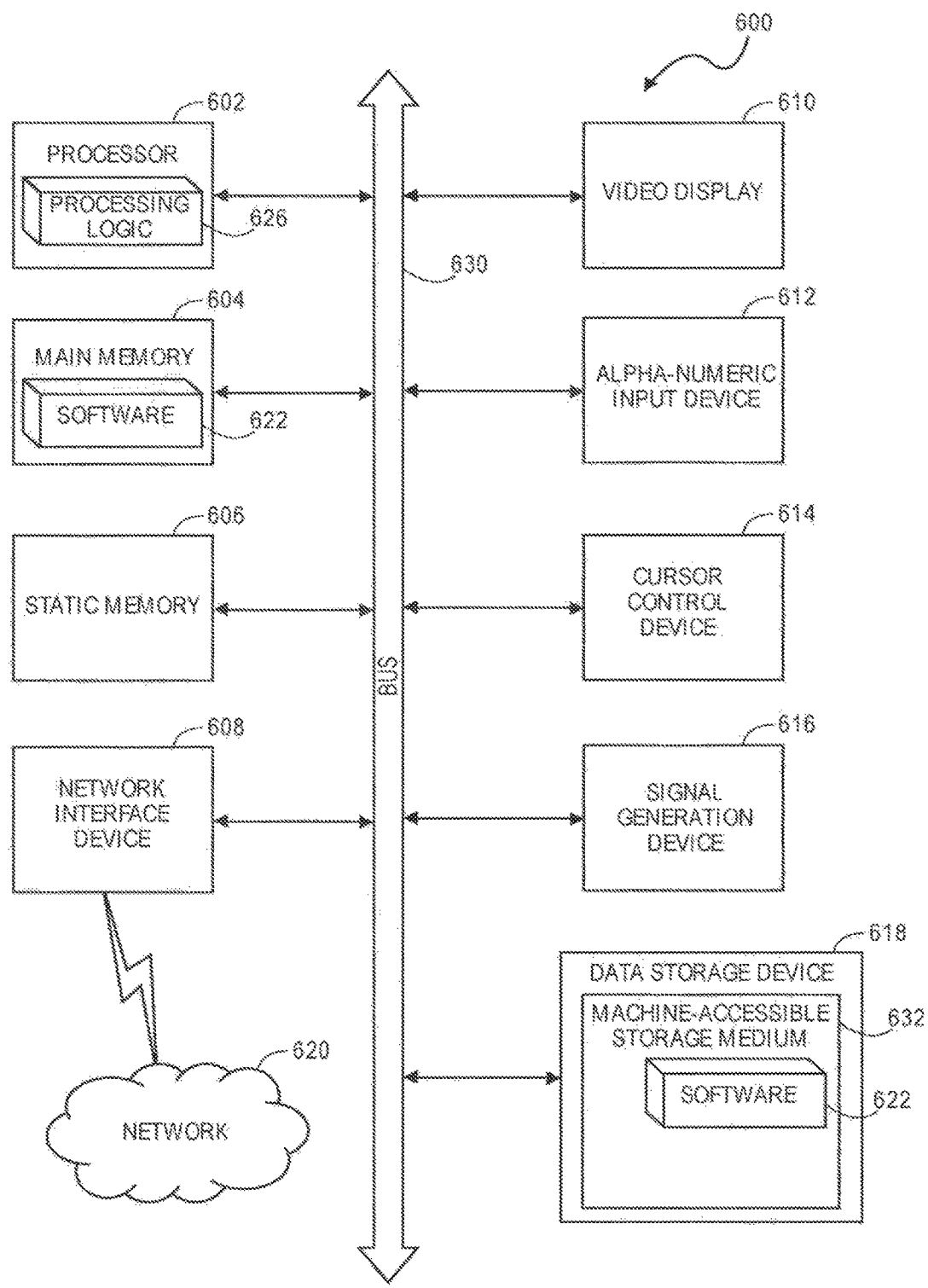
FIG. 6 illustrates a block diagram of an exemplary computer system that may be used in conjunction with processes for utilizing chemically modifiable alloyed carbon layers, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations according to embodiments described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A carbon-based hardmask layer, comprising:
   a substrate; and
   an amorphous carbon layer above the substrate, the amorphous carbon layer comprising carbon and hydrogen, and the amorphous carbon layer comprising a metallic filler bonded to the carbon, wherein a total atomic percentage of the hydrogen in the amorphous carbon layer is between 5% and 50%, and the total atomic percentage of the metallic filler in the amorphous carbon layer is between 5% and 90%.

2. The carbon-based hardmask layer of claim 1, wherein the metallic filler is further bonded to the hydrogen.

3. The carbon-based hardmask layer of claim 1, wherein the metallic filler further comprises metal-metal bonds.

4. The carbon-based hardmask layer of claim 1, wherein the metallic filler is further bonded to the hydrogen, and wherein the metallic filler further comprises metal-metal bonds.

5. The carbon-based hardmask layer of claim 1, wherein the metallic filler is a metallic component selected from the group consisting of W, V, Nb, Ta, Ti, Zr, Hf, and Al.

6. The carbon-based hardmask layer of claim 1, wherein the metallic filler is boron.

7. The carbon-based hardmask layer of claim 6, wherein the amorphous carbon layer comprises B4C.

8. A carbon-based hardmask layer, comprising:
   a substrate; and
   an amorphous carbide layer above the substrate, the amorphous carbide layer comprising carbon and hydrogen, and the amorphous carbide layer comprising a metallic filler bonded to the carbon, wherein a total atomic percentage of the hydrogen in the amorphous carbide layer is between 5% and 50%, and the total atomic percentage of the metallic filler in the amorphous carbide layer is between 5% and 90%.

9. The carbon-based hardmask layer of claim 8, wherein the metallic filler is further bonded to the hydrogen.

10. The carbon-based hardmask layer of claim 8, wherein the metallic filler further comprises metal-metal bonds.

11. The carbon-based hardmask layer of claim 8, wherein the metallic filler is further bonded to the hydrogen, and wherein the metallic filler further comprises metal-metal bonds.

12. The carbon-based hardmask layer of claim 8, wherein the metallic filler is a metallic component selected from the group consisting of W, V, Nb, Ta, Ti, Zr, Hf, and Al.

13. The carbon-based hardmask layer of claim 8, wherein the metallic filler is boron.

14. The carbon-based hardmask layer of claim 13, wherein the amorphous carbide layer comprises B4C.

15. A carbon-based hardmask layer, comprising:
   a substrate; and
   an amorphous carbon and carbide layer above the substrate, the amorphous carbon and carbide layer comprising carbon and hydrogen, and the amorphous carbon and carbide layer comprising a metallic filler bonded to the carbon, wherein a total atomic percentage of the hydrogen in the amorphous carbon and carbide layer is between 5% and 50%, and the total atomic percentage of the metallic filler in the amorphous carbon and carbide layer is between 5% and 90%.

16. The carbon-based hardmask layer of claim 15, wherein the metallic filler is further bonded to the hydrogen.

17. The carbon-based hardmask layer of claim 15, wherein the metallic filler further comprises metal-metal bonds.

18. The carbon-based hardmask layer of claim 15, wherein the metallic filler is further bonded to the hydrogen, and wherein the metallic filler further comprises metal-metal bonds.

19. The carbon-based hardmask layer of claim 15, wherein the metallic filler is a metallic component selected from the group consisting of W, V, Nb, Ta, Ti, Zr, Hf, and Al.

20. The carbon-based hardmask layer of claim 15, wherein the metallic filler is boron, and wherein the amorphous carbon and carbide layer comprises B4C.

* * * * *